US007940731B2

(12) United States Patent
Gao et al.

(10) Patent No.: US 7,940,731 B2
(45) Date of Patent: May 10, 2011

(54) LOAD BALANCING METHOD FOR A WIRELESS AREA NETWORK

(75) Inventors: Yin Gao, Shenzhen (CN); Bo Sun, Shenzhen (CN); Shaohua Wu, Shenzhen (CN); Fengguo Ma, Shenzhen (CN); Feng Li, Shenzhen (CN)

(73) Assignee: ZTE Corporation, Guangdong Province (CN)

( * ) Notice: Subject to any disclaimer, the term of this patent is extended or adjusted under 35 U.S.C. 154(b) by 430 days.

(21) Appl. No.: 11/622,863

(22) Filed: Jan. 12, 2007

(65) Prior Publication Data

US 2007/0115906 A1 May 24, 2007

(51) Int. Cl.
*H04W 4/00* (2009.01)
*H04W 72/00* (2009.01)
*H04W 36/00* (2009.01)

(52) U.S. Cl. ........ 370/338; 370/328; 370/329; 455/453; 455/432.1; 455/435.1; 455/435.2; 455/436

(58) Field of Classification Search ............... 370/338, 370/209, 401, 329; 455/453, 450, 432.1, 455/435.1–435.3, 436, 447, 448, 452.1; 709/241, 709/238
See application file for complete search history.

(56) References Cited

U.S. PATENT DOCUMENTS

| | | | |
|---|---|---|---|
| 6,069,871 A * | 5/2000 | Sharma et al. ................ 370/209 |
| 6,718,359 B2 * | 4/2004 | Zisapel et al. ................ 718/105 |
| 6,748,222 B1 * | 6/2004 | Hashem et al. ............... 455/453 |
| 7,400,901 B2 * | 7/2008 | Kostic et al. .................. 455/525 |
| 2002/0049842 A1 * | 4/2002 | Huetsch et al. ............... 709/225 |
| 2003/0134642 A1 * | 7/2003 | Kostic et al. .................. 455/450 |
| 2003/0191856 A1 * | 10/2003 | Lewis et al. ................... 709/241 |
| 2004/0199668 A1 * | 10/2004 | Lin et al. ....................... 709/241 |
| 2005/0053046 A1 * | 3/2005 | Wang ............................ 370/338 |
| 2005/0100029 A1 * | 5/2005 | Das ............................... 370/401 |
| 2005/0208950 A1 * | 9/2005 | Hasse ............................ 455/453 |
| 2008/0228942 A1 * | 9/2008 | Lor et al. ...................... 709/238 |

* cited by examiner

*Primary Examiner* — Jinsong Hu
*Assistant Examiner* — Mong-Thuy Tran
(74) *Attorney, Agent, or Firm* — Connolly Bove Lodge & Hutz LLP

(57) ABSTRACT

The present invention relates to a load balancing method for a wireless local area network, which includes the following steps: initializing the load balancing group, self-organizing to select an online access point from the load balancing group as a load balancing agent center, each access point of the said balancing group managing and processing the load balance in accordance with the load level and balance optimizing policy, therefore implements the network load balance. The method of the invention improves reliability of the network load information, presents the load information from invalidly broadcasting in the wireless local area network, therefore reduces the additional overhead for managing the load balance of the wireless network, particularly in the network that having three layers switching equipment, self-organizing to select the agent center can utilize the network resource in effect, therefore managing the dynamic load balance information much more effectively, reducing the dependence on the upper server, and managing the network much more flexibly.

7 Claims, 3 Drawing Sheets

LOAD BALANCING METHOD FOR A WIRELESS AREA NETWORK

RELATED APPLICATIONS

This application is a national stage application (under 35 U.S.C. 371) of PCT/CN2004/000783 filed Jul. 12, 2004.

FIELD OF THE INVENTION

The present invention relates to a wireless area network system in the field of communication, particularly relates to a method for implementing a load balancing system in a wireless local area network.

BACKGROUND OF THE INVENTION

ANSI/IEEE Std 802.11, 1999 Edition 802.11 standard is a standard instituted by the Wireless Local Area Network Standard Working Group for physical layer protocol and medium access control (MAC) protocol, which facilitates the establishment of the interoperating network equipment by the wireless local area network devices manufacturers and wireless devices manufacturers. Physical layer defines the signal feature and signal modulation of data transfer. The medium access control (MAC) layer can be deemed as being composed of a series of services which can accomplish the functions such as information exchange, power control, association management, synchronal management and process management.

WLAN (wireless local area network) means interconnecting computer devices by using wireless communication technology, so as to configure a network system capable of communicating with each other and implementing a resource sharing. In a WLAN network environment, an extended service set system is composed of one or a plurality of base service sets and a distribution system in the connection with the above, each of which at least comprises one wireless access point apparatus. The extended services sets are distinguished by ESSID (Extended Services Sets Identifier) and the wireless access points are distinguished by BSSID (Basic Services Sets Identifier). A station obtains the information of the Extended Services Sets and Basic Services Sets in the present WLAN environment by scanning channels and selects to join an appropriate basic services set. Load balance in WLAN is a strategy, under which a wireless local area network system comprises a plurality of access points providing access services to a variety of mobile stations, wherein each of the access point members allows or rejects the access of a mobile station by station management using network information, thereby balancing the network load, taking full advantage of the available network resource and reducing the network congestion. Usually the distribution of access points joining the load balancing should meet the conditions that a station can selectively get access to another access point with lower load, when the access point rejects the access of the station owing to overload; access points meeting the above-mentioned conditions are divided in a group called load group, the station must selectively get access to an access point in the load group, the access point having relative lower load and relative most appropriate for the access of the station.

The current wireless local area network protocol has not stipulated how the load balance processing is conducted and how the load balance information is exchanged in the network. The regular implementing method is collecting and managing the network load balance information under the information exchange protocol between the access points, wherein the load balance information brings a great deal of additional overhead when it is being broadcasted in the network; moreover, the unicity of the load balance information renders a low quality of the station access, which makes against the optimized management to the whole network. In regard to a WLAN network conducting access and resource optimization, it is advantageous for the improvement of the quality of the network communication to implement an optimized load balancing system with high performance.

BRIEF SUMMARY OF THE INVENTION

The object of the present invention is to provide a method for implementing a load balancing system in a wireless local area network to improve the reliability of the network load balance information and prevent the load information from invalidly broadcasting in the wireless local area network, thereby reducing the additional overhead for managing the load balance of the wireless network, particularly in the network having three-layers switching equipment, self-organizing selection of a load balancing agent center can manage the dynamic load balance information much more effectively, reduce the dependence on the upper server, and manage the network much more flexible by utilizing the network resource in effect.

In order to achieve the afore-said object of the invention, the present invention classifies the load information as the following types:

(1) Static Load Information: usually being determined by system resource of the local access point. For instance: frequency of CPU, capacity of memory, and capability of network connections, which information determines the maximum load of individual access point.

(2) Statistic Load Information: statistic information is extracted from the historical performance data. For instance: delay and bandwidth, which information reflects the typical capacity of the access points and network connections, and is especially important, particularly when optimized management is conducted over classified business owing to QoS (Quality of Service) requirements.

(3) Dynamic Load Information: dynamic information usually means the real-time load level information of the network, which is sent when the current load level of the each member of the load balancing group changes.

The first two types of load information can be obtained and stored by an access point locally, while the last type of load information is collected and saved by the load balancing agent center.

An access point, basing on the local load information and load information obtained from the load balancing agent center, accepts or rejects access of a station in accordance with certain balance optimizing strategy.

Generally, the method of the present invention comprises the following steps:

Step 1, initializing the load balancing group in the wireless local area network, self-organizingly selecting an access point from the online access points in the load balancing group as a load balancing agent center; and Step 2, each access point of the said balancing group managing and processing the load balance in accordance with the load level and balance optimizing strategy, so as to implement the network load balance.

In the phase of initializing the load balancing group, the current online access points, basing on the load level, self-organizingly select an access point as a load balancing agent center by information exchange between the devices, wherein the access point with the lowest current load level is usually selected as the load balancing agent center. Self-organizing selection is conducted again in the load balancing group to select another access point as the load balancing agent center, only when the load level of the load balancing agent center exceeds the agent center threshold (defined as the maximum load level of a load balancing agent center), so the load balancing agent center is changeable. After the load balancing agent center is selected, other access points in the load balancing group act as non-load-balancing agent centers.

In a load balancing group, only the load balancing agent center needs to record the load information of other access points of the same load balancing group, while the access points acting as non-load-balancing agent centers just need to acknowledge the location of the load balancing agent center. The load information is reported to the load balancing agent center when the load of the access points acting as the non-load-balancing agent centers is changing. Meanwhile the network load information of the present load balancing group can be obtained from the load balancing agent center, and load balancing management is conducted by combining with load balance information locally stored. The load balancing agent center only acts as a distributing center of the dynamic information, and the concrete load balancing processing is conducted by the non-load-balancing agent centers based on the load balance information of the load balancing agent center and the local load balance information.

The processing procedure of a WLAN load balancing system:

Load balancing agent center processing algorithms and non-load-balancing agent center processing algorithms employ threshold strategy, viz. each access point has respective an upper load limit MAX and a lower load limit MIN, when the load level of the access point is lower than the lower load limit MIN, the access point is under low load, allows the access of a station, and does not send the load change information, so that the load information exchange in the network can be decreased and the load balancing overhead of the WLAN network can be alleviated; when the load level of the access point waves between the upper load limit MAX and the lower load limit MIN, it works normally, once the load level changes, the access point sends dynamic load information to the load balancing agent center; when the load level of the access point exceeds the upper load limit, the access point is under high load and rejects the access of the station.

In detail the present invention provide a method for implementing a load balancing system in a wireless area network, including the following steps:

Step 1, initializing the load balancing group in the wireless local area network, self-organizingly selecting an access point from the online access points in the load balancing group as a load balancing agent center; and Step 2, each access point of the said balancing group managing and processing the load balance in accordance with the load level and balance optimizing strategy, so as to implement the network load balance.

During the network operation of the wireless local area network, the said method for implementing a load balancing system in a wireless area network is used for self-organizing selection, basing on the load level, to select another access point as a new load balancing agent center in the said load balancing group by the information exchange between the devices, when the load level of the load balancing agent center exceeds the agent center threshold.

In step 1 of the said method for implementing a load balancing system in a wireless area network is to select the access point with the lowest current load level in the said load balancing group as a load balancing agent center, and after selecting the load balancing agent center, other access points in the said load balancing group act as non-load-balancing agent centers.

In step 2 of the said method for implementing a load balancing system in a wireless area network, only the load balancing agent center needs to record the load information of other access points acting as the non-load-balancing agent centers in the same load balancing group, while the access points acting as non-load-balancing agent centers just need to acknowledge the location of the load balancing agent center; the load information is reported to the load balancing agent center, when the load of the access points acting as a non-load-balancing agent centers is changing, meanwhile the network load information of the present load balancing group can be obtained from the load balancing agent center, and the load balancing management is conducted by combining with the load balance information locally stored.

In step 2 of the said method for implementing a load balancing system in a wireless area network, a threshold strategy is used for the access points, each of which including the access points acting as the load balancing agent center and non-load-balancing agent centers, wherein an upper load limit MAX and lower load limit MIN are set respectively to conduct the management and processing of load balance, the strategy is as follows:

when the load level of the access point is lower than the lower load limit MIN, the access point is under low load, allows access of a station, and does not send the load change information, so that the load information exchange in the network can be decreased and the load balancing overhead of the WLAN network can be alleviated;

when the load level of the access point waves between the upper load limit MAX and the lower load limit MIN, it works normally and allows the access of the station, dynamic load information is sent to the load balancing agent center, once the load level of the access point changes; and when the load level of the access point is higher than the upper load limit MAX, the access point is under high load and rejects the access of the station.

In the said method for implementing a load balancing system in a wireless area network, the processing procedure of the load balancing agent center comprises the following steps:

creating or succeeding to the load information table of all the online access points in the said load balancing group;

monitoring the load information of other current online access points acting as non-load-balancing agent centers in the said load balancing group, and receiving and saving said information;

detecting the local load level of the access point acting as a load balancing agent center, conducting load level processing by combining with the network information of the said load information table, and updating the local load level of the said access point acting as a load balancing agent center;

keeping on monitoring and receiving the load information of other current online access points acting as non-load-balancing agent centers in the said load balancing group when the newest local load level is lower than the agent center threshold; and communicating with the online access points in the present load balancing group, self-organizingly selecting another appropriate access point as a new load balancing agent center according to the load level, and transferring the load balance information locally stored to the new balancing agent center as informing the other access points in the load balancing group of the address of the new load balancing agent center when the newest local load level exceeds the agent center threshold.

In the said method for implementing a load balancing system in a wireless area network, the processing procedure of the non-load-balancing agent centers comprises the following steps:

detecting the local load level of the non-load-balancing agent centers;

conducting load level processing according to the current load level and updating the local load level record of the access points acting as non-load-balancing agent centers when the current load level is lower than the lower load limit MIN;

obtaining load information of the load balancing group from the load balancing agent center and conducting load level processing by using load balancing algorithms in combination with the local load information when the current load level is higher than the lower load level limit MIN;

updating the local load level when the newest load level of the said non-load-balancing agent centers is lower than the lower load level limit MIN after processing; and sending local load level information to the load balancing agent center and updating the local load level when the newest load level is higher than the lower load level limit MIN after processing.

The method for implementing a load balancing system in a wireless area network further comprises a step of classifying the load information, wherein the load information is classified as:

Static Load Information obtained and stored by the local system resource of the access point, including frequency of CPU, capacity of memory, and capability of network connections;

Statistic Load Information obtained and stored by the historical performance data of the local system of the access points, including delay and bandwidth;

Dynamic Load Information collected and saved by the load balancing agent center, including real-time load level information of the network.

According to the said method for implementing a load balancing system in a wireless area network, when one load balancing group comprises only one access point, the said access point will act as the load balancing agent center.

In regard to a mobile station in a load balancing group, the said method for implementing a load balancing system in a wireless area network is to selectively get access to an access point in the load balancing group, the access point having relative lower access load and most appropriate for the access of said station, so that the said station can get access to another access point with relative lower load in the same load balancing group when an access point rejects the access of the said station owing to overload.

DETAILED DESCRIPTION OF THE INVENTION

The present invention will be further described in conjunction with the figures and embodiments in the following.

Figure 1:
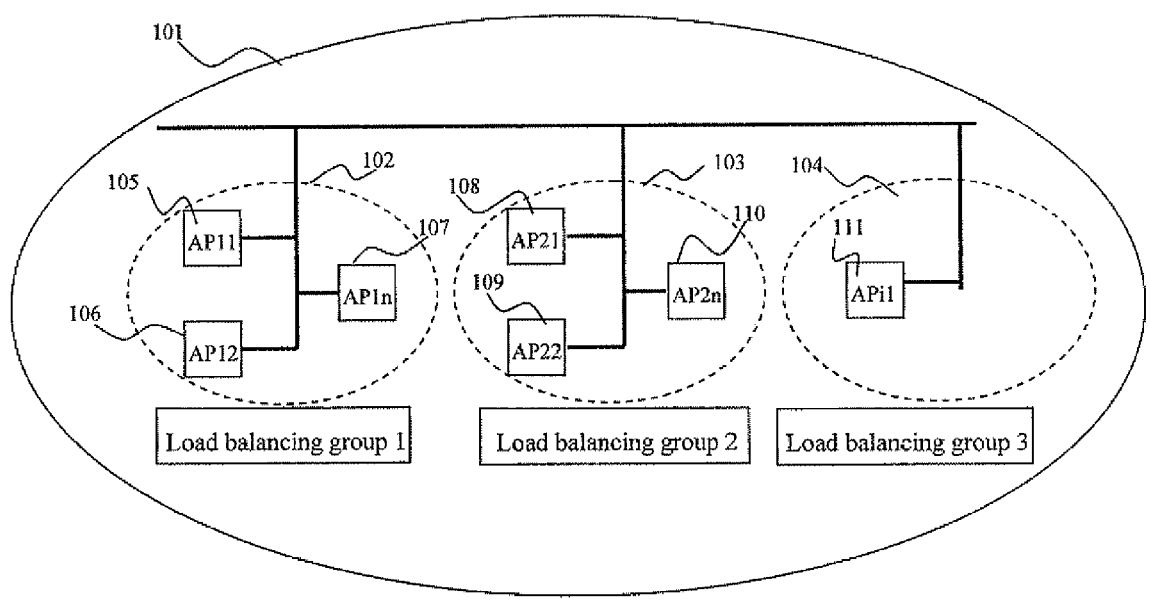
FIG. 1 is a schematic structure diagram of a load balancing group in a wireless local area network.

FIG. 1 is a schematic structure diagram of a load balancing group in a wireless local area network.

All APs (Access Point) of the whole distributed system 101 communicate with each other via backbone network. The distributed system 101 divides all the APs into several load balancing groups 102-104 according to the status of the access points and wireless local area network. When an AP rejects the access of a station due to overload, the station can selectively get access to another AP with lower load in the load balancing group. The grouping is reflected in the configuration information of the access point by manual means. When there is only a single AP in a load balancing group, the AP will act as a load balancing agent center, such as the access point 11I in the drawing.

Each of APs 105~111, which are distributed in the load balancing group, can be accessed by one or a plurality of stations STA. The load level of an AP determines whether the next station requesting access can get access thereto, and the load level of an AP is determined by the load information locally stored and the dynamic load information in the network. In the configuration information of an AP, it can be confirmed by a mark, in which load balancing group the AP is. The load balancing configuration of the AP can be edited during the processing of the WLAN network.

Figure 2:
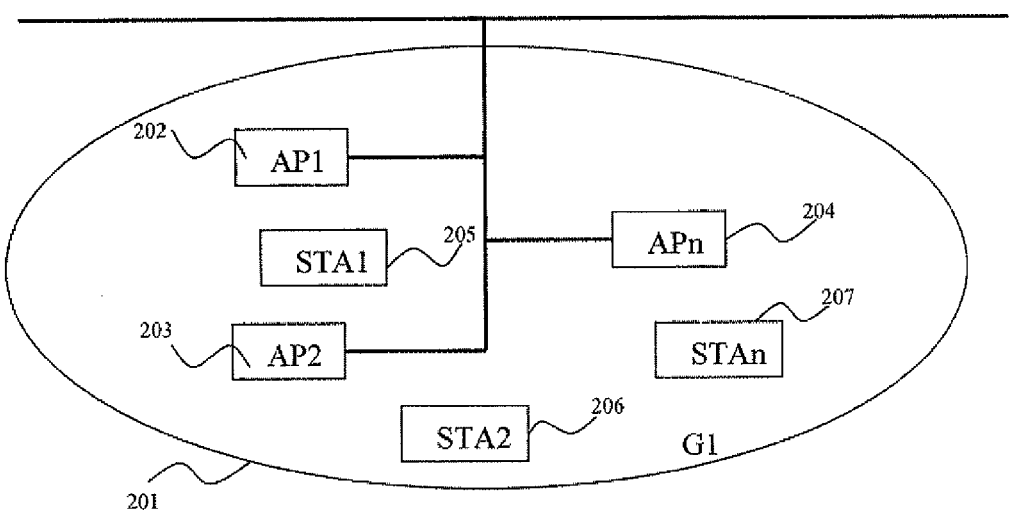
FIG. 2 is a schematic diagram of the implementation of a load balancing group in the wireless local area network according to the present invention.

FIG. 2 is a schematic diagram of the implementation of a load balancing group in the wireless local area network according to the present invention.

In the drawing a load balancing group 201 is indicated as G1, to which the access points (AP) 202~204 are distributed. The load level of each AP is determined by the load balance information locally stored and the dynamic load balance information which obtained by the respective AP via the exchange under equipment private protocol. A load balancing group comprises only one load balancing agent center, and other access points act as non-load-balancing agent centers. When the G1 is initialized, by exchange under private protocol between devices, the access points 202~204 self-organizingly select an AP with the lowest load as a load balancing agent center, such as the access point 202, on which a load information table of the online AP devices in the present load balancing group is created, wherein the states of the access point are defined as low load, formal operation and high load, the load information table is saved and updated according to the online and offline information and load information sent by the access point device. During the operation of the WLAN network, when the load level of the access point 202 is higher than the upper limit of the agent level, by conducting information exchange again, the access points 202~204 self-organizingly select a new load balancing agent center, such as the access point 203, according to the load level, and the access 202 transfers the saved load information table to the access point 203 while sending broadcasting message in the load balancing group to inform the address of the new load balancing agent center.

Stations (STA) 205~207 get access to the load balancing group G1. A station STA must selectively get access to an access point with relative lower load and relative most appropriate for the access of the station in the load balancing group. In G1, the station STA can easily get access to other access points with lower load in the same load balancing group, when an AP rejects the access of a station STA owing to overload.

Figure 3:
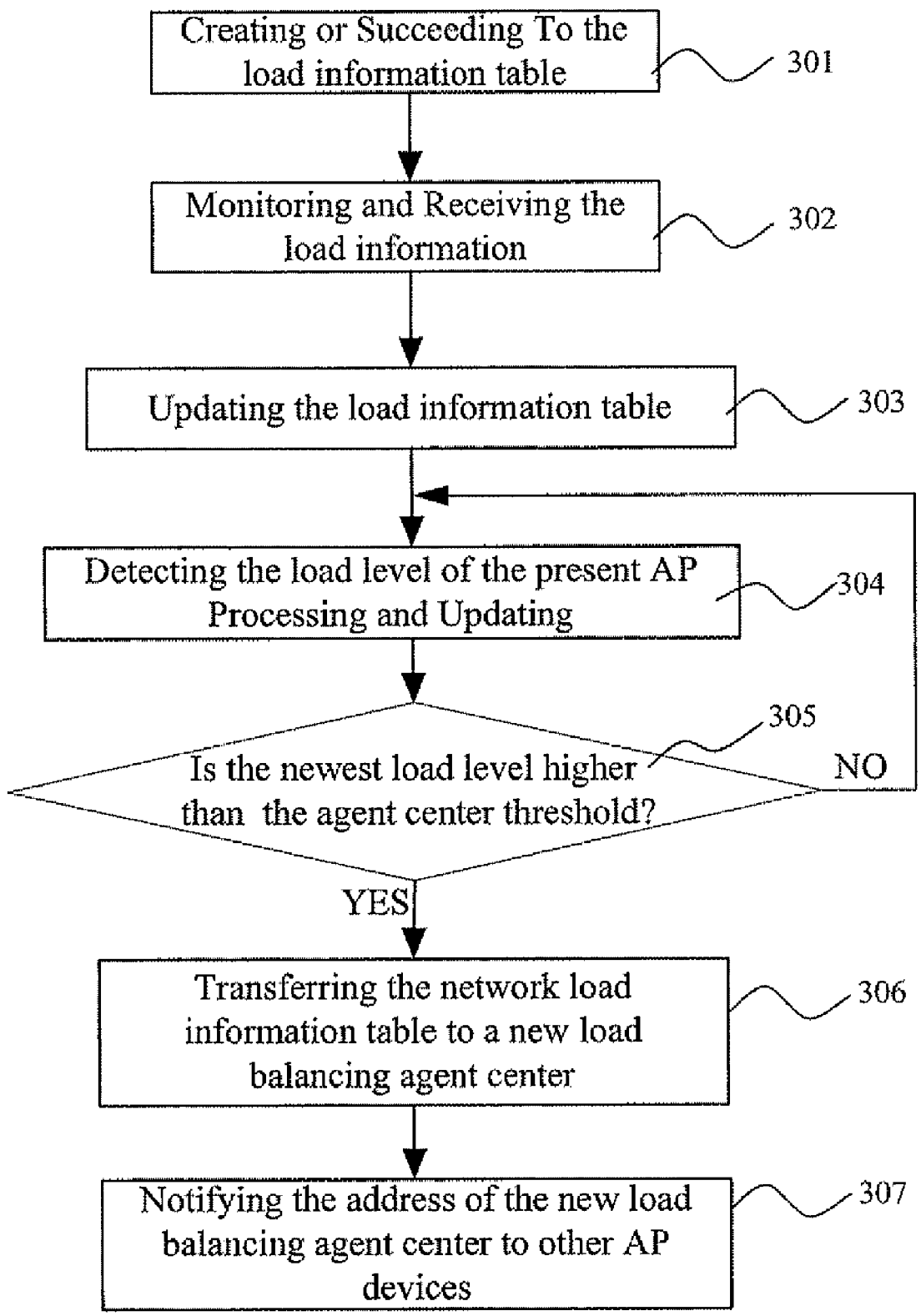
FIG. 3 is a flow diagram of the load balancing agent center according to the present invention.

FIG. 3 is a flow diagram of the load balancing agent center according to the present invention.

Step 301, selecting the AP as the load balancing agent center, creating a new load information table during the initialization of the load balancing group; succeeding to the load information table, which includes the load information of other online APs of the devices, from the old load balancing agent center during the operation of the WLAN network.

Step 302, monitoring and receiving the load information that sent by other APs of the load balancing group in the WLAN network.

Step 303, saving the received load information, and updating the load information of the APs, which send the said information, in the load information table.

Step 304, detecting the load level of the present AP, conducting load level processing in the combination with the network load information recorded by the load information table, and updating the load level of the present AP. Station access processing is conducted in accordance with the present load level, the access of a station STA will be allowed when the load level is lower than the upper limit of the load level, while the access of the station STA will be rejected when the load level is higher than the upper limit of the load level.

Step 305, turning to Step 302 when the newest load level is lower than the agent threshold; while turning to Step 306 when the newest load level is higher than the agent threshold.

Step 306, sending the load balancing group a broadcasting message with the request of selecting a new load balancing agent center, self-organizingly selecting an AP with the lowest load level as the load balancing agent center, and transferring the load information table to the new load balancing agent center.

Step 307, sending a broadcasting message to the load balancing group to inform other APs of the address of the new load balancing agent center.

Figure 4:
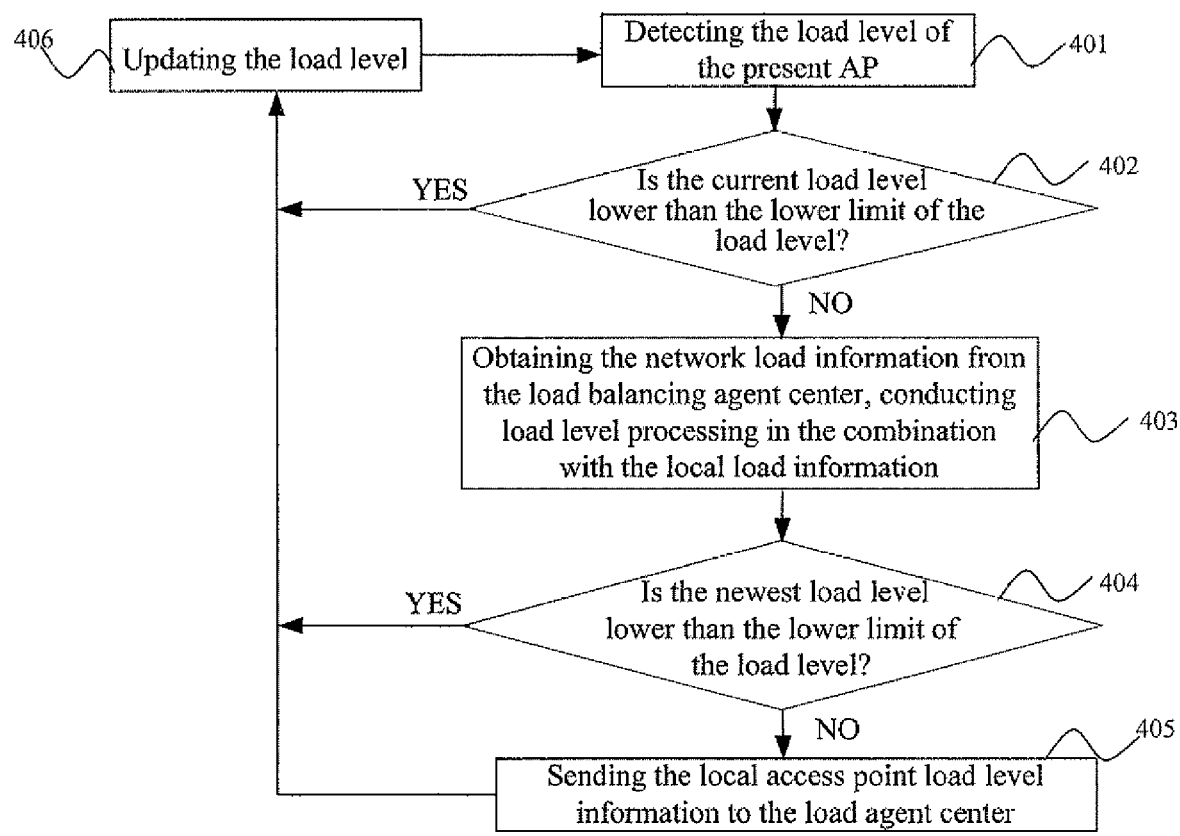
FIG. 4 is a flow diagram of the non-load-balancing agent center according to the present invention.

FIG. 4 is a flow diagram of the non-load-balancing agent center according to the present invention.

Step 401, detecting the local load level of the present AP.

Step 402, turning to Step 406 when the newest load level is lower than the lower limit of the load level; while turning to Step 403 when the newest load level is equal to or higher than the lower limit of the load level.

Step 403, obtaining network load information from the load balancing agent center, and conducting load level processing by combining with the local load level information.

Step 404, turning to Step 406 when the newest load level after the processing is lower than the lower limit of the load level; turning to Step 405 when the newest load level after the processing is equal to or higher than the lower limit of the load level.

Step 405, sending the load level information of the present AP to the load balancing agent center.

Step 406, updating and saving the load level information of the present AP, conducting station access processing on the basis of the current load level, allowing the access of a station STA when the load level is lower than the upper limit of the load level, while rejecting the access of the station STA when the load level is equal to or higher than the upper limit of the load level.

While the present invention has been particularly shown and described with reference to the embodiments thereof, it will be understood by those skilled in the art that any amendment or equivalent replacement made to the technical solution of the present invention without departing from the spirit and scope of the present invention shall all be covered by the scope of the claims of the present invention.

INDUSTRIAL APPLICABILITY

The method according to the present invention is defined as more comprehensive load balance information, which is conducive to the implementation of more improved load balancing management; the load balancing system of the WLAN is implemented by self-organizingly selecting a load balancing agent center, the unoccupied resource of the whole network is completely utilized, and the additional overhead of the network communication brought by the load balance information is reduced, which is conductive to the improvement of the level of the resource optimization of the whole network; and the use of the load balancing agent center can reduce the dependence on the upper server, so that the network load management is more suitable.

What is claimed is:

1. A method for implementing a load balancing system in a wireless area network, comprising:
   step 1, initializing a load balancing group of online access points in the wireless area network, self-organizingly selecting one of the access points from the online access points in said load balancing group as a load balancing agent center; and
   step 2, each access point of said balancing group managing and processing load balance in accordance with a load level and balance optimizing strategy, so as to implement the network load balance;
   wherein the access point with a lowest current load level in the load balancing group is selected as the load balancing agent center, and after the load balancing agent center is selected, other access points in the load balancing group act as non-load-balancing agent centers, and
   wherein only said load balancing agent center needs to record the load information of other access points acting as the non-load-balancing agent centers in the same load balancing group, while the access points acting as non-load-balancing agent centers just need to acknowledge the location of the load balancing agent center, wherein load information is reported to the load balancing agent center when the load of the access points acting as the non-load-balancing agent centers is changing, and the non-load-balancing agent centers obtain network load information of the load balancing group from the load balancing agent center, and load balancing management is conducted by combining with load balance information locally stored; and
   wherein in step 2, a threshold strategy is used for the access points, each of which including the access points acting as the load balancing agent center and the non-load-balancing agent centers, wherein an upper load limit MAX and a lower load limit MIN are set respectively to conduct management and processing of load balance as follows:
      when the load level of the access point is lower than the lower load limit MIN, the access point is under low load, allows access of a station, and does not send load change information;
      when the load level of the access point waves between the upper load limit MAX and the lower load limit MIN, the access point works normally and allows station access, and dynamic load change information is sent to said load balancing agent center, once the load level of the access point changes; and
      when the load level of the access point is higher than the upper load limit MAX, the access point is under high load and rejects station access.

2. The method for implementing a load balancing system in a wireless area network of claim 1, wherein during network operation of the wireless area network, another access point is self-organizingly selected from the load balancing group as a new load balancing agent center via an information exchange between devices in accordance with the load level, when the load level of the load balancing agent center exceeds an agent center threshold.

3. The method for implementing a load balancing system in a wireless area network of claim 1, wherein a processing procedure of the load balancing agent center comprises:
   creating a load information table of all the online access points in said load balancing group;
   monitoring the load information of other current online access points acting as non-load-balancing agent centers in said load balancing group, and receiving and saving said information;
   detecting a local load level of the access point acting as said load balancing agent center, conducting load level processing by combining with the network information of said load information table, and updating the local load level of said access point acting as the load balancing agent center;
   keeping on monitoring and receiving the load information of other current online access points acting as non-load-balancing agent centers in the load balancing group when a newest local load level is lower than the agent center threshold; and
   communicating with the online access points in the present load balancing group, self-organizingly selecting another appropriate access point as a new load balancing agent center according to the load level, and transferring load balance information locally stored to the new balancing agent center and informing the other access points in the load balancing group of an address of the new load balancing agent center when the newest local level exceeds the agent center threshold.

4. The method for implementing a load balancing system in a wireless area network of claim 3, wherein in regard to a mobile station in a load balancing group, selectively getting access to an access point in the load balancing group, the access point having relative lower access load and being most appropriate for access of said station from the load balancing group, so that said station can get access to another access point with relative lower load in the same load balancing group when an access point rejects access of said station owing to overload.

5. The method for implementing a load balancing system in a wireless area network of claim 1, wherein a processing procedure of the non-load-balancing agent centers comprises:
   detecting a local load level of the non-load-balancing agent centers;
   conducting load level processing according to the current load level and updating a local record of the load level of the access points acting as non-load-balancing agent centers when the current load level is lower than the lower load limit MIN;
   obtaining load information of the load balancing group from the load balancing agent center and conducting load level processing by using load balancing algorithms in combination with the local load information when the current load level is higher than the lower load level limit MIN;
   updating the local load level when a newest load level of the non-load-balancing-agent-centers is lower than the lower load level limit MIN after processing; and
   sending local load level information to the load balancing agent center and updating the local load level when the newest load level is higher than the lower load level limit MIN after processing.

6. The method for implementing a load balancing system in a wireless area network of claim 1, further comprising classifying the load information, wherein the load information is classified as:
   Static Load Information obtained and stored by a local system resource of the access point, including frequency of CPU, capacity of memory, and capability of network connections;
   Statistic Load Information obtained and stored by a historical performance data of the local system of the access points, including delay and bandwidth; and
   Dynamic Load Information collected and saved by the load balancing agent center, including real-time load level information of the network.

7. The method for implementing a load balancing system in a wireless area network of claim 1, wherein when the load balancing group comprises only one access point, said access point will act as the load balancing agent center.

* * * * *